United States Patent
Lim et al.

(10) Patent No.: US 12,490,387 B2
(45) Date of Patent: Dec. 2, 2025

(54) ADHESIVE CIRCUIT PATTERNING PROCESS

(71) Applicant: Jabil Inc., St. Petersburg, FL (US)

(72) Inventors: LaiMing Lim, Penang (MY); Zambri Bin Samsudin, Penang (MY)

(73) Assignee: Jabil Inc., St. Petersburg, FL (US)

( * ) Notice: Subject to any disclaimer, the term of this patent is extended or adjusted under 35 U.S.C. 154(b) by 0 days.

(21) Appl. No.: 16/278,472

(22) Filed: Feb. 18, 2019

(65) Prior Publication Data

US 2020/0267844 A1     Aug. 20, 2020

(51) Int. Cl.
| | |
|---|---|
| *H05K 3/30* | (2006.01) |
| *H05K 1/02* | (2006.01) |
| *H05K 3/32* | (2006.01) |

(52) U.S. Cl.
CPC ........ *H05K 3/305* (2013.01); *H05K 1/0277* (2013.01); *H05K 3/321* (2013.01)

(58) Field of Classification Search
CPC ........ H05K 3/284; H05K 3/305; H05K 3/321; H05K 3/4632; H05K 1/0277; H05K 1/0283; H05K 2201/0129; H05K 1/189; H05K 3/0058; H05K 2203/1311; H05K 1/038; A61N 1/0484; A61B 5/6804
USPC ........................................ 156/308.2
See application file for complete search history.

(56) References Cited

U.S. PATENT DOCUMENTS

| | | | |
|---|---|---|---|
| 5,128,746 A * | 7/1992 | Pennisi | B23K 35/3613 |
| | | | 257/793 |
| 5,328,654 A * | 7/1994 | Dixit | B29C 55/005 |
| | | | 264/108 |
| 7,036,387 B2 | 5/2006 | Ong et al. | |
| 2006/0169405 A1 * | 8/2006 | Smith | B32B 37/10 |
| | | | 156/308.2 |
| 2014/0084045 A1 | 3/2014 | Yang et al. | |

(Continued)

FOREIGN PATENT DOCUMENTS

| | | | |
|---|---|---|---|
| CN | 208410719 U | * | 1/2019 |
| EP | 3364728 A1 | | 8/2018 |

(Continued)

OTHER PUBLICATIONS

Machine translation of CN 208410719 date unknown.*

(Continued)

*Primary Examiner* — John L Goff, II

(74) *Attorney, Agent, or Firm* — Young Basile Hanlon & MacFarlane, P.C.

(57) ABSTRACT

Disclosed are processes and materials for adhesive circuit patterning which strengthen and protect printed circuit traces and adhesive bonded joints of surface mounted devices in flexible or stretchable electronics in a single process. A method for adhesive circuit pattering include desposing a circuit pattern on a thermal adhesive film. One or more surface mounted device(s) are attached to a cured printed circuit to form an assembled printed circuit. The assembled printed circuit may be placed on a stretchable substrate. The thermal adhesive film is melted on the assembled printed circuit and the stretchable substrate to protect and reinforce joint bonds and the circuit pattern of the assembled circuit pattern and attach the assembled printed circuit to the stretchable fabric in one melting or curing step.

7 Claims, 12 Drawing Sheets

(56) References Cited

U.S. PATENT DOCUMENTS

| | | | |
|---|---|---|---|
| 2014/0124257 A1* | 5/2014 | Yoshihara | H05K 1/023 |
| | | | 174/350 |
| 2016/0130471 A1* | 5/2016 | Burrows | H05K 1/095 |
| | | | 174/251 |
| 2016/0212845 A1 | 7/2016 | Nakashima et al. | |
| 2016/0358849 A1 | 12/2016 | Jur et al. | |
| 2018/0168076 A1 | 6/2018 | Chao et al. | |
| 2019/0053546 A1* | 2/2019 | Nakao | H05K 3/007 |

FOREIGN PATENT DOCUMENTS

| | | | | |
|---|---|---|---|---|
| KR | 20150075912 A | 7/2015 | | |
| WO | 2017125852 A1 | 7/2017 | | |
| WO | WO-2017159456 A1 * | 9/2017 | | A41D 1/005 |
| WO | WO-2019020550 A2 * | 1/2019 | | A61F 13/00055 |

OTHER PUBLICATIONS

Wordnet, search for "curing", date unknown.*
Maarten Cauwe et al. A chip embedding solution based on low-cost plastic materials as enabling technology for smart labels. 2012 4th Electronic System-integration Technology Conference, Sep. 20, 2012, pp. 1-6.
Lauren R. Finkenauer et al. Complaint liquid metal electrodes for dielectric elastomer actuators. Proceedings for SPIE—The international Society for Optical Engineering, vol. 9056:905631, Mar. 2014.
Partial Supplementary European Search Report dated Mar. 16, 2022, from European Application No. 20759051.4.

* cited by examiner

ADHESIVE CIRCUIT PATTERNING PROCESS

TECHNICAL FIELD

This disclosure relates to flexible electronics and circuits.

BACKGROUND

Flexible electronics such as printed, stretchable electronics, electronic textiles and the like undergo or are subject to bending, twisting, stretching, rolling, pushing, and the like. The printed circuit traces, sensors, adhesive bonded joints of surface mounted devices, and the like that form these flexible electronics may be weakened from the mechanical strain and result in open circuits. Traditional encapsulation processes are normally used to protect the adhesive bonded joints of surface mounted devices and lamination processes employing polyethylene terephthalate (PET), polyimide (PI), and polycarbonate (PC) films are commonly used to protect circuit traces. Consequently, multiple different techniques are needed to mitigate device failure from mechanical strain.

Other techniques such as circuit embroidery, flocking and direct conductive ink screen printing have also been used. However, each has disadvantages. Circuit embroidery has high cost of raw material cost (conductive yarn), limited supplier chain, high capital expenditure, is not suitable for high dense circuitry and miniaturization products, is not suitable for surface mounted device assembly, uses non-standard electronics assembly process, has limited washable cycle which requires additional waterproofing process, and has low interconnect reliability on the surface mounted device packages. Flocking also has high raw material cost (sub-nanometal particle materials), limited supplier chain, high capital expenditure, not suitable for high dense circuitry and miniaturization products, uses a health hazardous process for dispersion of nanoparticles onto substrates, non-standard electronics assembly process, has limited washable cycle which requires additional waterproofing process, and has low interconnect reliability on the surface mounted device packages. Direct conductive ink screen printing suffers from printing repeatability and consistency of the printed circuit pattern, not suitable for high dense circuitry and miniaturization products, has limited washable cycle which requires additional waterproofing process, and has low interconnect reliability on the surface mounted device packages.

SUMMARY

Disclosed herein are implementations of processes and materials for adhesive circuit patterning which strengthen and protect printed circuit traces and adhesive bonded joints of surface mounted devices and attachment to stretchable or flexible electronics in a single process. Disclosed are processes and materials for adhesive circuit patterning which strengthen and protect printed circuit traces and adhesive bonded joints of surface mounted devices in flexible or stretchable electronics in a single process.

In an implementation, a method for adhesive circuit pattering include deposing a circuit pattern on a thermal adhesive film. One or more surface mounted device(s) are attached to a cured printed circuit to form an assembled printed circuit. The assembled printed circuit may be placed on a stretchable substrate. The thermal adhesive film is melted on the assembled printed circuit and the stretchable substrate to protect and reinforce joint bonds and the circuit pattern of the assembled circuit pattern and attach the assembled printed circuit to the stretchable fabric in one melting or curing step.

BRIEF DESCRIPTION OF THE DRAWINGS

The disclosure is best understood from the following detailed description when read in conjunction with the accompanying drawings and are incorporated into and thus constitute a part of this specification. It is emphasized that, according to common practice, the various features of the drawings are not to-scale. On the contrary, the dimensions of the various features are arbitrarily expanded or reduced for clarity.

DETAILED DESCRIPTION

Figure 1:
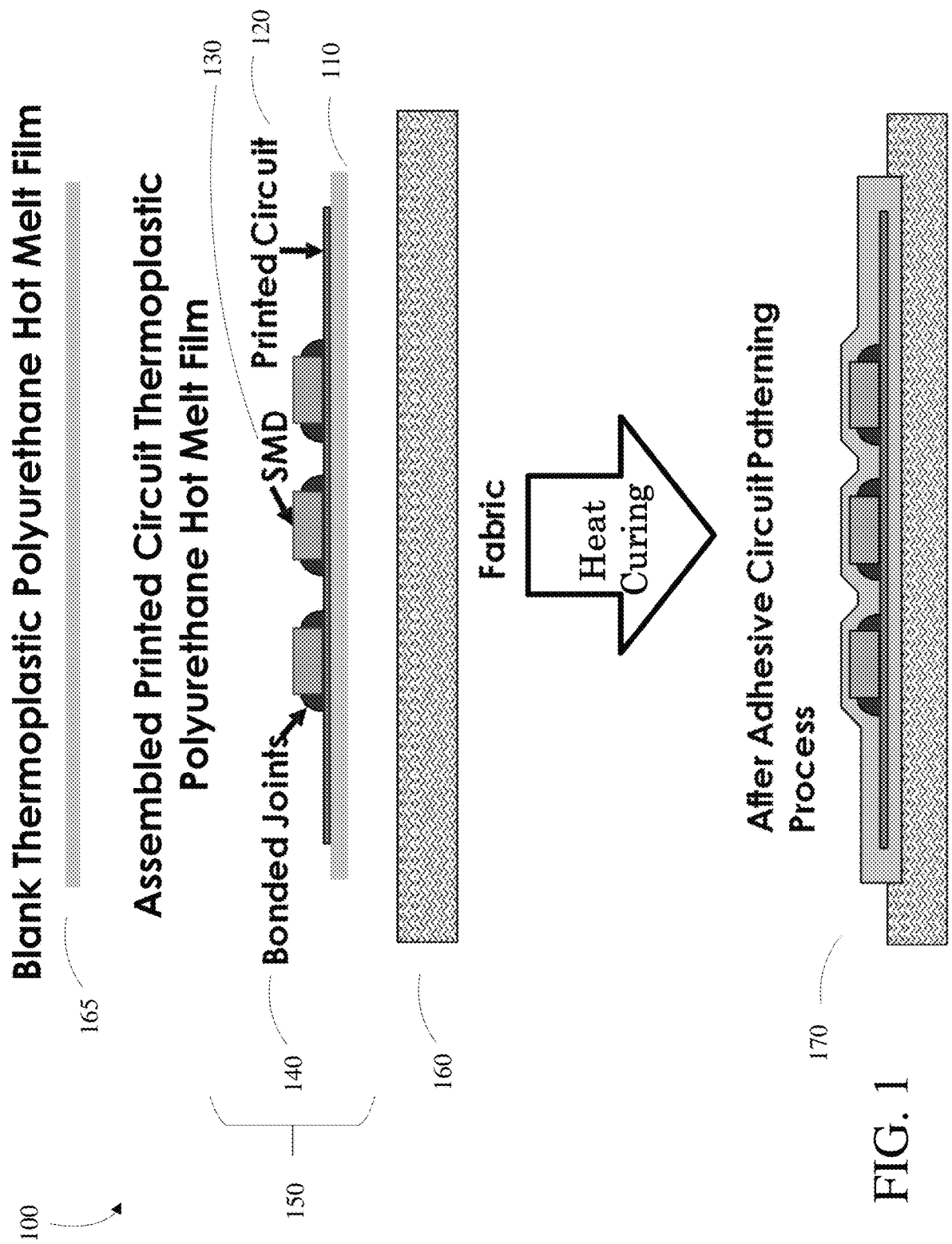
FIG. 1 is a flow diagram of a process for adhesive circuit patterning in accordance with certain implementations.

The figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Embodiments are provided throughout so that this disclosure is sufficiently thorough and fully conveys the scope of the disclosed embodiments to those who are skilled in the art. Numerous specific details are set forth, such as examples of specific aspects, devices, and methods, to provide a thorough understanding of embodiments of the present disclosure. Nevertheless, it will be apparent to those skilled in the art that certain specific disclosed details need not be employed, and that embodiments may be embodied in different forms. As such, the exemplary embodiments set forth should not be construed to limit the scope of the disclosure.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, steps, operations, elements, and/or components, but do not preclude the presence or addition of one or more other features, steps, operations, elements, components, and/or groups thereof.

The steps, processes, and operations described herein are thus not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

Yet further, although the terms first, second, third, etc. may be used herein to describe various elements, steps or aspects, these elements, steps or aspects should not be limited by these terms. These terms may be only used to distinguish one element or aspect from another. Thus, terms such as "first," "second," and other numerical terms when used herein do not imply a sequence or order unless clearly indicated by the context. Thus, a first element, step, component, region, layer or section discussed below could be termed a second element, step, component, region, layer or section without departing from the teachings of the disclosure.

The non-limiting embodiments described herein are with respect to a method for adhesive circuit patterning. The method for adhesive circuit patterning may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the method for adhesive circuit patterning including, for example but not limited to, flexible electronics.

Described herein is a method for adhesive circuit patterning. In an implementation, the method for adhesive circuit patterning attaches a printed circuit onto a flexible substrate, for example, with more robustness using a single heat curing process. The adhesive circuit patterning process reinforces the bonded joints of surface mounted devices and the printed circuit traces. The adhesive circuit patterning process protects the surface of the bonded joints and the printed circuit traces. In an implementation, the adhesive circuit patterning process results in an environmentally-proof device, for example, a device that is water resistant, moisture proof, and has an easy to clean surface.

FIG. 1 is a flow diagram of a process 100 for adhesive circuit patterning in accordance with certain implementations. The process 100 may include preparation of blank thermoplastic polyurethane hot melt films 110 and 165. Although thermoplastic polyurethane hot melt film is described herein, implementations may use thermal adhesive films and the like onto which a circuit pattern may be printed, screen printed and the like, and thereafter go through a curing process. In an implementation, the curing process is a heat curing process. In the example implementation, the blank thermoplastic polyurethane hot melt films 110 and 165 may undergo drying to prevent shrinkage and drive out moisture. For example, the blank thermoplastic polyurethane hot melt films 110 and 165 may be dried for 2-4 hours at a temperature of 70°–80° C.

After drying, a circuit trace or circuit pattern (collectively circuit pattern) may be printed on the blank thermoplastic polyurethane hot melt film 110. This is shown as printed circuit 120. Although printing is described herein, other techniques may be used to deploy the printed circuit 120 on the blank thermoplastic polyurethane hot melt film 110 without departing from the scope of the description and the claims herein. The printed circuit 120 on the thermoplastic polyurethane hot melt film 110 are collectively heat cured. In an implementation, the softening point of the thermoplastic polyurethane hot melt films 110 and 165 is around 80°–120° C. and the melting point is around 150° C. (being heated for 45 minutes). The temperatures and times are illustrative and may vary depending on the type of thermal adhesive film being used.

After curing, surface mounted devices 130 may be bonded or otherwise attached to the printed circuit 120, shown as bonded joints 140, to form an assembled printed circuit thermoplastic polyurethane hot melt film 150. In an implementation, a heat curing process is done after placement of the surface mounted devices 130 on the printed circuit 120. The assembled printed circuit thermoplastic polyurethane hot melt film 150 may then be placed on a stretchable and/or flexible substrate such as, for example, fabric 160. The blank thermoplastic polyurethane hot melt film 165 may then be placed on top of the assembled printed circuit thermoplastic polyurethane hot melt film 150 to reinforce the bonded joints 140 of the surface mounted device 130 and to protect the printed circuit 120. That is, the bonded joints 140 of the surface mounted device 130 and the printed circuit 120 are sandwiched between two thermoplastic polyurethane hot melt films 110 and 165. The collective entity is heat cured to form an adhesive circuit patterned device 170.

Figure 2:
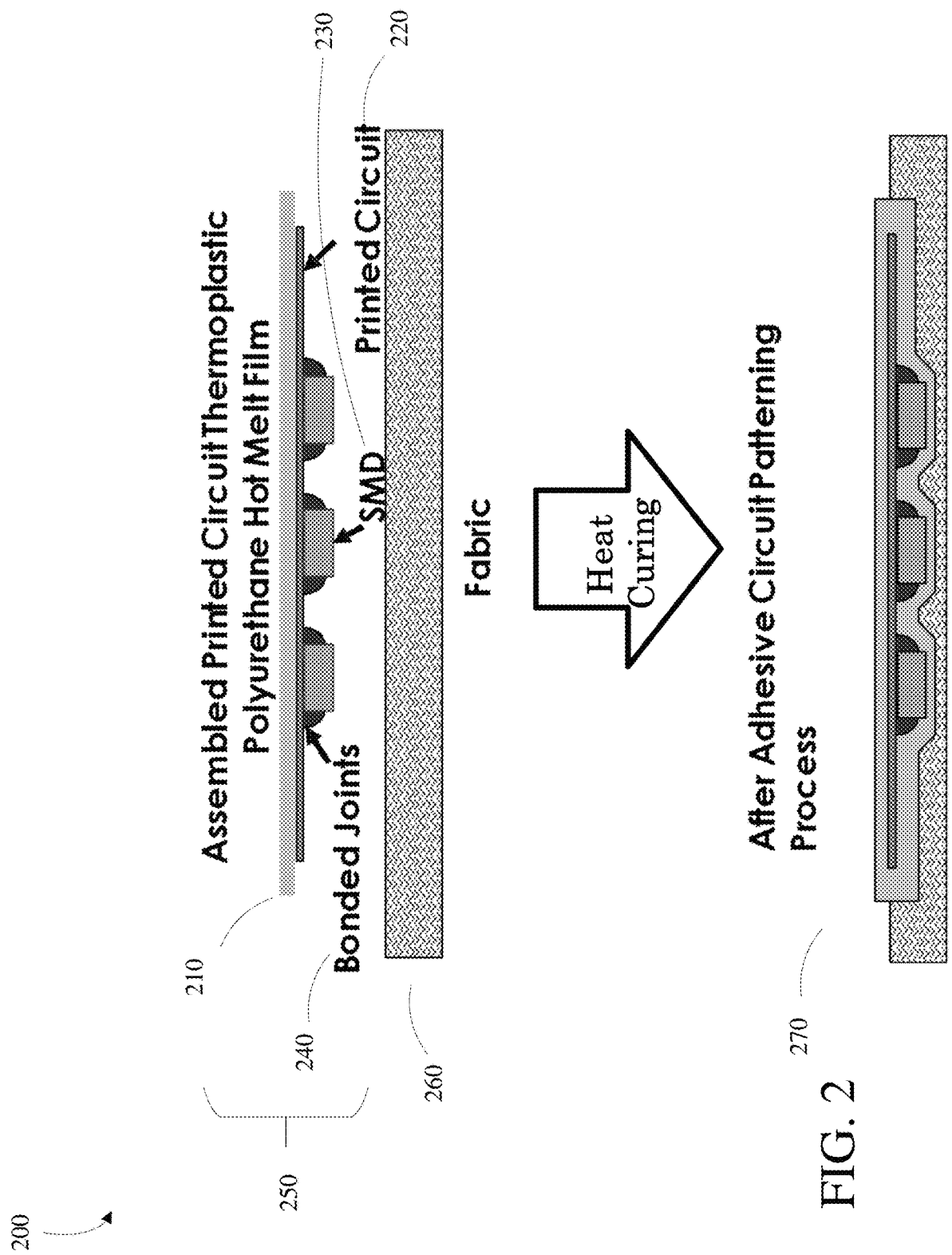
FIG. 2 is a flow diagram of a process for adhesive circuit patterning in accordance with certain implementations.

FIG. 2 is a flow diagram of a process 200 for adhesive circuit patterning in accordance with certain implementations. The process 200 may include preparation of a blank thermoplastic polyurethane hot melt film 210. Although thermoplastic polyurethane hot melt film is described herein, implementations may use thermal adhesive films and the like onto which a circuit pattern may be printed, screen printed and the like, and thereafter go through a curing process. In an implementation, the curing process is a heat curing process. In the example implementation, the blank thermoplastic polyurethane hot melt film 210 may undergo drying to prevent shrinkage and drive out moisture. For example, the blank thermoplastic polyurethane hot melt film 210 may be dried for 2-4 hours at a temperature of 70°–80° C.

After drying, a circuit trace or circuit pattern (collectively circuit pattern) may be printed on the blank thermoplastic polyurethane hot melt film 210. This is shown as printed circuit 220. Although printing is described herein, other techniques may be used to deploy the printed circuit 220 on the blank thermoplastic polyurethane hot melt film 210 without departing from the scope of the description and the claims herein. The printed circuit 220 on the thermoplastic polyurethane hot melt film 210 are collectively heat cured. In an implementation, the softening point of the thermoplastic polyurethane hot melt film 210 is around 80°–120° C. and the melting point is around 150° C. (being heated for 45 minutes). The temperatures and times are illustrative and may vary depending on the type of thermal adhesive film being used.

After curing, surface mounted devices 230 may be bonded or otherwise attached to the printed circuit 220, shown as bonded joints 240, to form an assembled printed circuit thermoplastic polyurethane hot melt film 250. In an implementation, a heat curing process is done after placement of the surface mounted devices 230 on the printed circuit 220. The assembled printed circuit thermoplastic polyurethane hot melt film 250 is then placed on a stretchable and/or flexible substrate such as, for example, fabric 260 with a populated side of the assembled printed circuit thermoplastic polyurethane hot melt film 250 facing the fabric 260. The collective entity is heat cured to form an adhesive circuit patterned device 270. In this implementation, by placing the populated side of the assembled printed circuit thermoplastic polyurethane hot melt film 250 on the fabric 260 and then heat curing, the thermoplastic polyurethane hot melt film 210 is able to reinforce the bonded joints 240 of the surface mounted device 230 and to protect the printed circuit 220. That is, the bonded joints 240 of the surface mounted device 230 and the printed circuit 220 are engulfed by the thermoplastic polyurethane hot melt film 210.

Figures 3A, 3B:
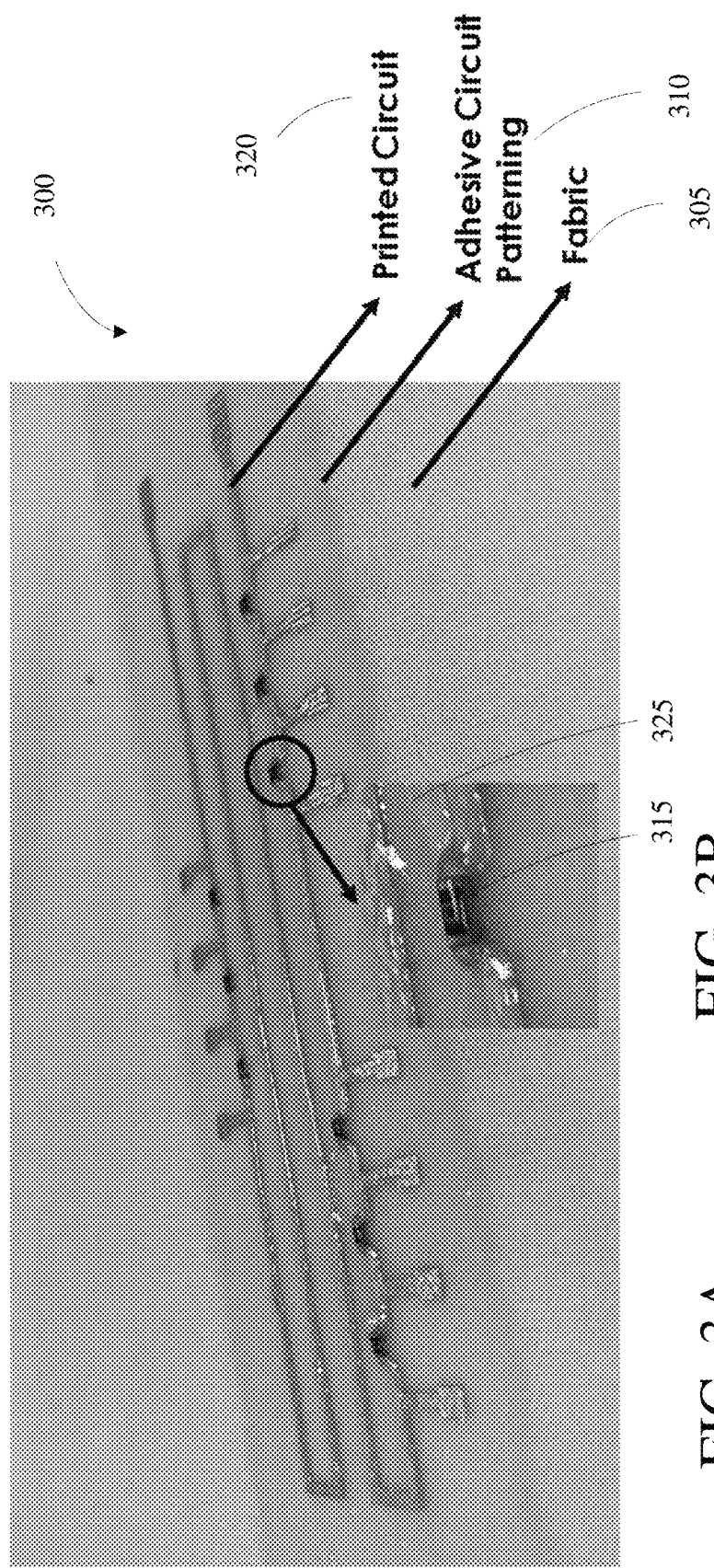
FIGS. 3A-B are example photographs of flexible electronics after application of the process for adhesive circuit patterning in accordance with certain implementations.

FIGS. 3A-B are example photographs of stretchable electronics 300 after application of the process for adhesive circuit patterning in accordance with certain implementations. The stretchable electronics 300 includes a stretchable and/or flexible substrate, such as for example, a fabric 305 which in turn includes one or more adhesive circuit patterned devices 310. The adhesive circuit patterned device 310 includes surface mounted device(s) 315 bonded to a printed circuit 320, which are sandwiched between thermoplastic adhesive films 325 or engulfed by the thermoplastic adhesive film 325, as applicable, for example.

Figures 4A, 4B:
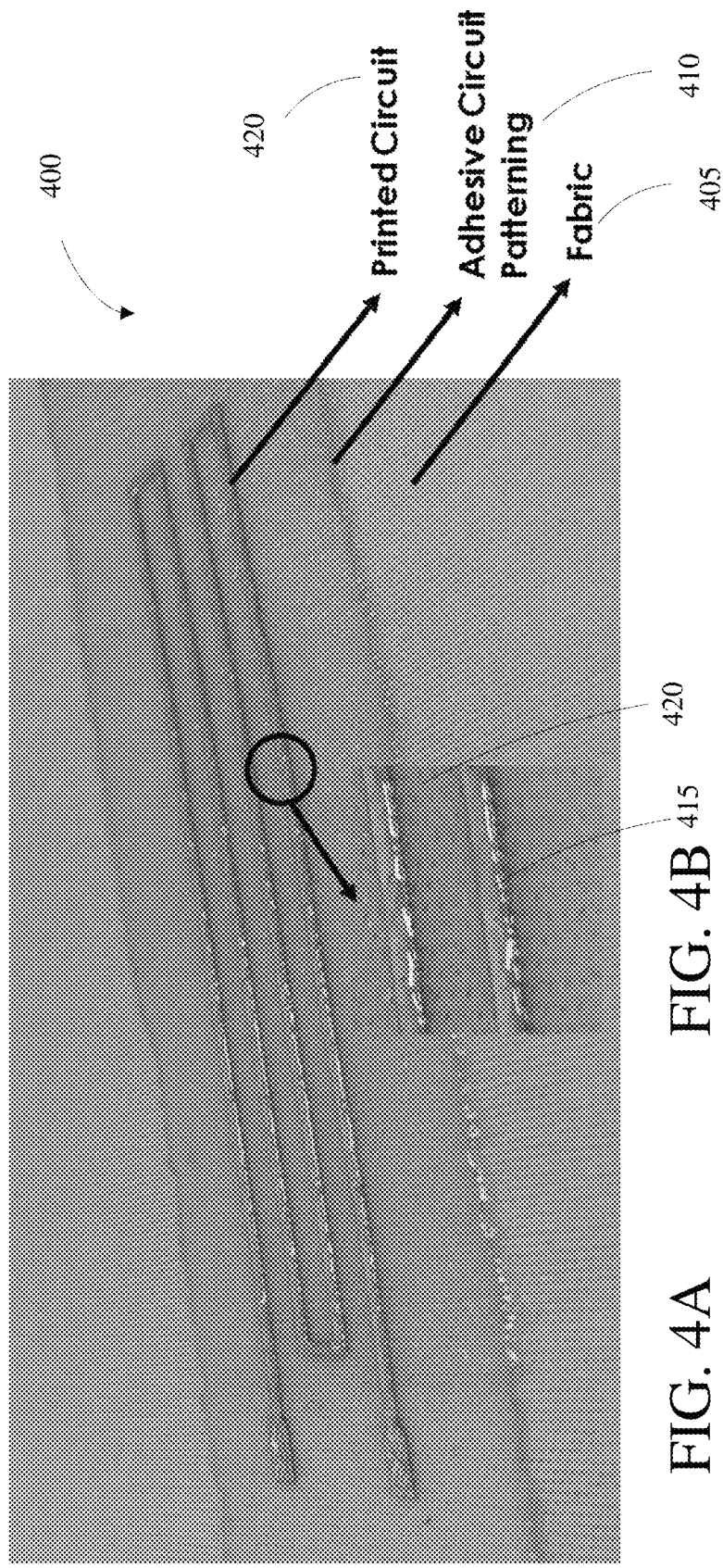
FIGS. 4A-B are example photographs of flexible electronics after application of the process for adhesive circuit patterning in accordance with certain implementations.

FIGS. 4A-B are example photographs of flexible electronics 400 after application of the process for adhesive circuit patterning in accordance with certain implementations. The stretchable or flexible electronics 400 includes a stretchable or flexible substrate, such as for example, a fabric 405 which in turn includes one or more adhesive circuit patterned device(s) 410. The adhesive circuit patterned device 410 includes a printed circuit 415 which is sandwiched between thermoplastic adhesive films 420 or engulfed by thermoplastic adhesive film 420, as applicable, for example.

Figure 5:
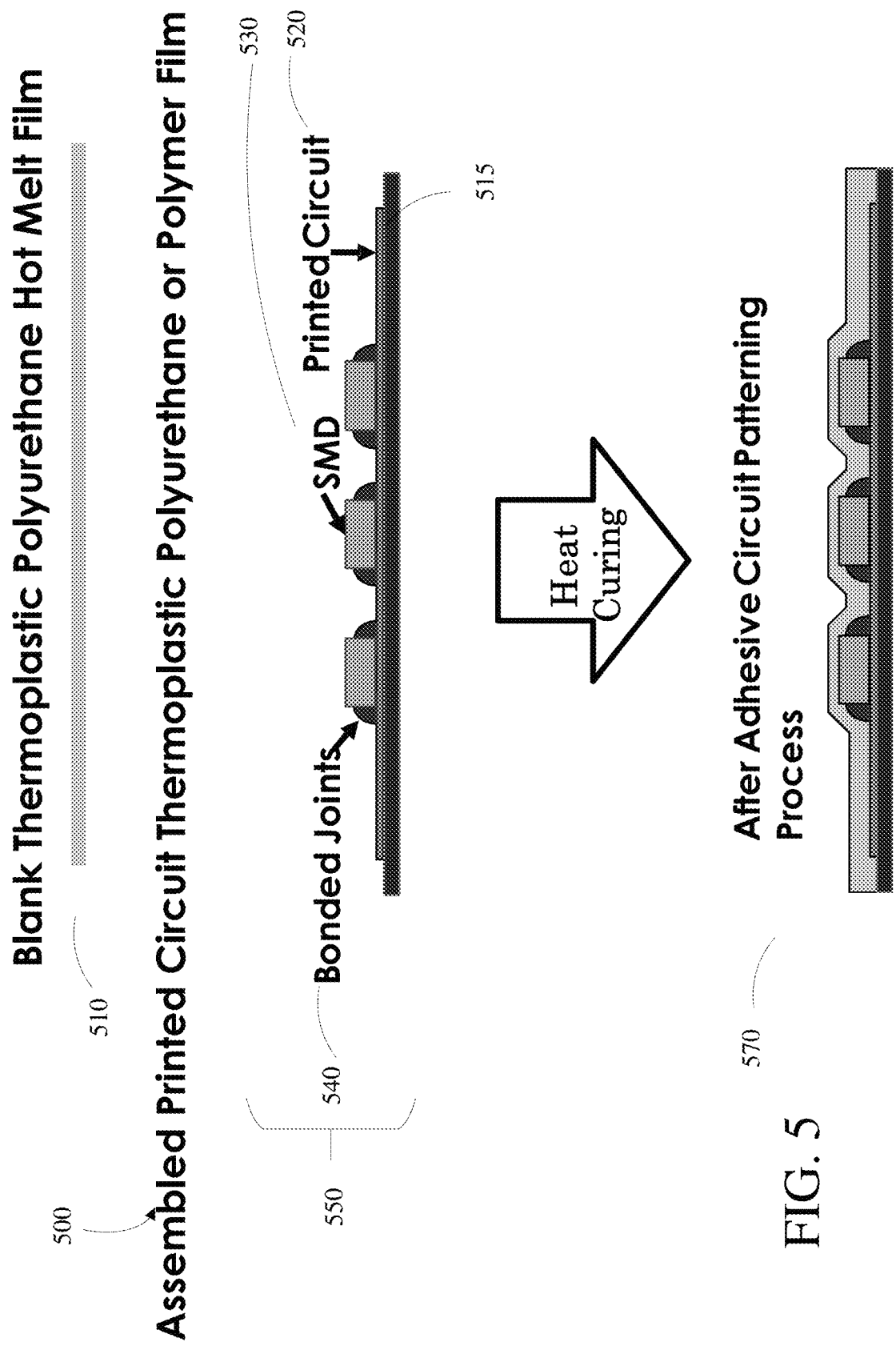
FIG. 5 is a flow diagram of a process for adhesive circuit patterning in accordance with certain implementations.

FIG. 5 is a flow diagram of a process 500 for adhesive circuit patterning in accordance with certain implementations. The process 500 may include preparation of a blank thermoplastic polyurethane hot melt film 510. Although thermoplastic polyurethane hot melt film is described herein, implementations may use thermal adhesive films, polymer films, polyethylene terephthalate (PET), polycarbonate (PC) and the like. In the example implementation, the blank thermoplastic polyurethane hot melt film 510 may undergo drying to prevent shrinkage and drive out moisture. For example, the blank thermoplastic polyurethane hot melt film 510 may be dried for 2-4 hours at a temperature of 70°–80° C. In an implementation, the softening point of the thermoplastic polyurethane hot melt film 510 is around 80°–120° C. and the melting point is around 150° C. (being heated for 45 minutes). The temperatures and times are illustrative and may vary depending on the type of thermal adhesive film being used.

A circuit trace or circuit pattern (collectively circuit pattern) may be printed on a blank thermoplastic polyurethane (TPU), any polymer film, and/or thermal film 515. This is shown as printed circuit 520. In an implementation, the blank TPU, polymer film or thermal film 515 may, prior to being printed on, undergo drying to prevent shrinkage and drive out moisture. Although printing is described herein, other techniques may be used to deploy the printed circuit 520 on the blank thermoplastic polyurethane or any polymer film 515 without departing from the scope of the description and the claims herein. The printed circuit 520 on the thermoplastic polyurethane or any polymer film 515 are collectively heat cured.

After curing, surface mounted devices 530 may be bonded or otherwise attached to the printed circuit 520, shown as bonded joints 540, to form an assembled printed circuit thermoplastic polyurethane or any polymer film 550. In an implementation, a heat curing process is done after placement of the surface mounted devices 530 on the printed circuit 520. The blank thermoplastic polyurethane hot melt film 510 may then be placed on top of the assembled printed circuit thermoplastic polyurethane or any polymer film 550 to reinforce the bonded joints 540 of the surface mounted device 530 and to protect the printed circuit 520. That is, the bonded joints 540 of the surface mounted device 530 and the printed circuit 520 are engulfed by the thermoplastic polyurethane hot melt film 510. The collective entity is heat cured to form n adhesive circuit patterned device 570.

Figure 6:
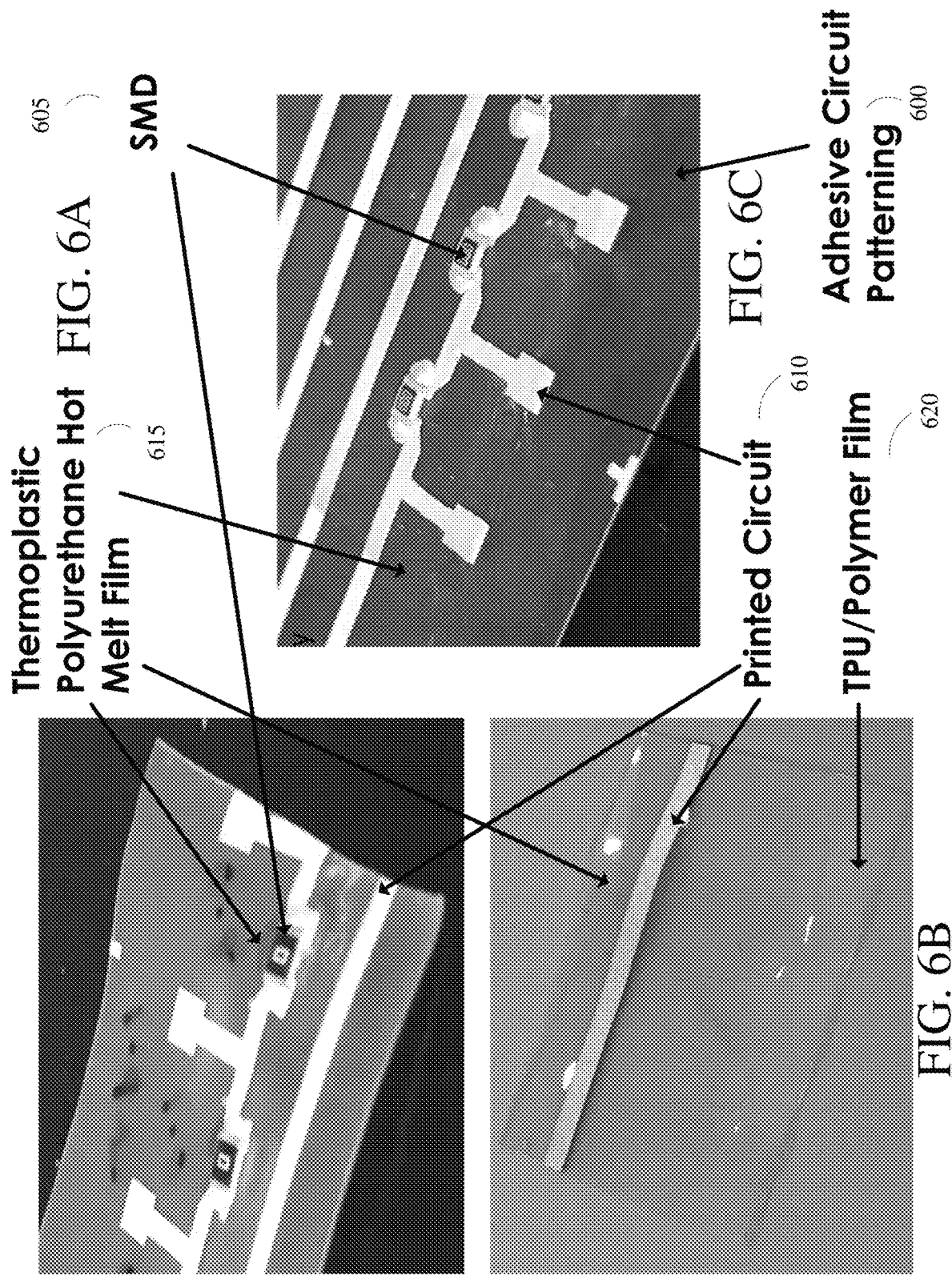
FIGS. 6A-C are example photographs of flexible electronics after application of the process for adhesive circuit patterning in accordance with certain implementations.

FIGS. 6A-C are example photographs of adhesive circuit patterned device 600 after application of the process for adhesive circuit patterning in accordance with certain implementations. The adhesive circuit patterned device 600 includes surface mounted device(s) 605 bonded to a printed circuit 610 which are sandwiched between or engulfed by thermoplastic adhesive film 615, for example. In an implementation, the printed circuit 610 is a circuit pattern printed on a TPU or any polymer film 620.

Strain gauges are sensors which convert force, pressure, tension, weight, and other like characteristics into a change in electrical resistance. Attachment of strain gauges to electronic circuit devices is problematic. For example, attaching a ±20% high elongation strain gauge onto a flexible electronic substrate is problematic because most of the materials used have non-reactive surfaces or are non-stick. A cyanoacrylate adhesive may overcome the attachment problem, but the maximum elongation is only 10%. Better or higher elongation may be achieved if 3145 RTV silicone adhesive is used, but adhesion is too weak. After a few stretches, the strain gauge comes off.

A high elongation strain gauge may be strongly bonded to the non-reactive surface using adhesive circuit patterning. In an implementation, a bonding process may be activated at a temperature above the melting point, and by adding some defined amount of pressure, the strain gauge may be bonded to the substrate.

Figure 7:
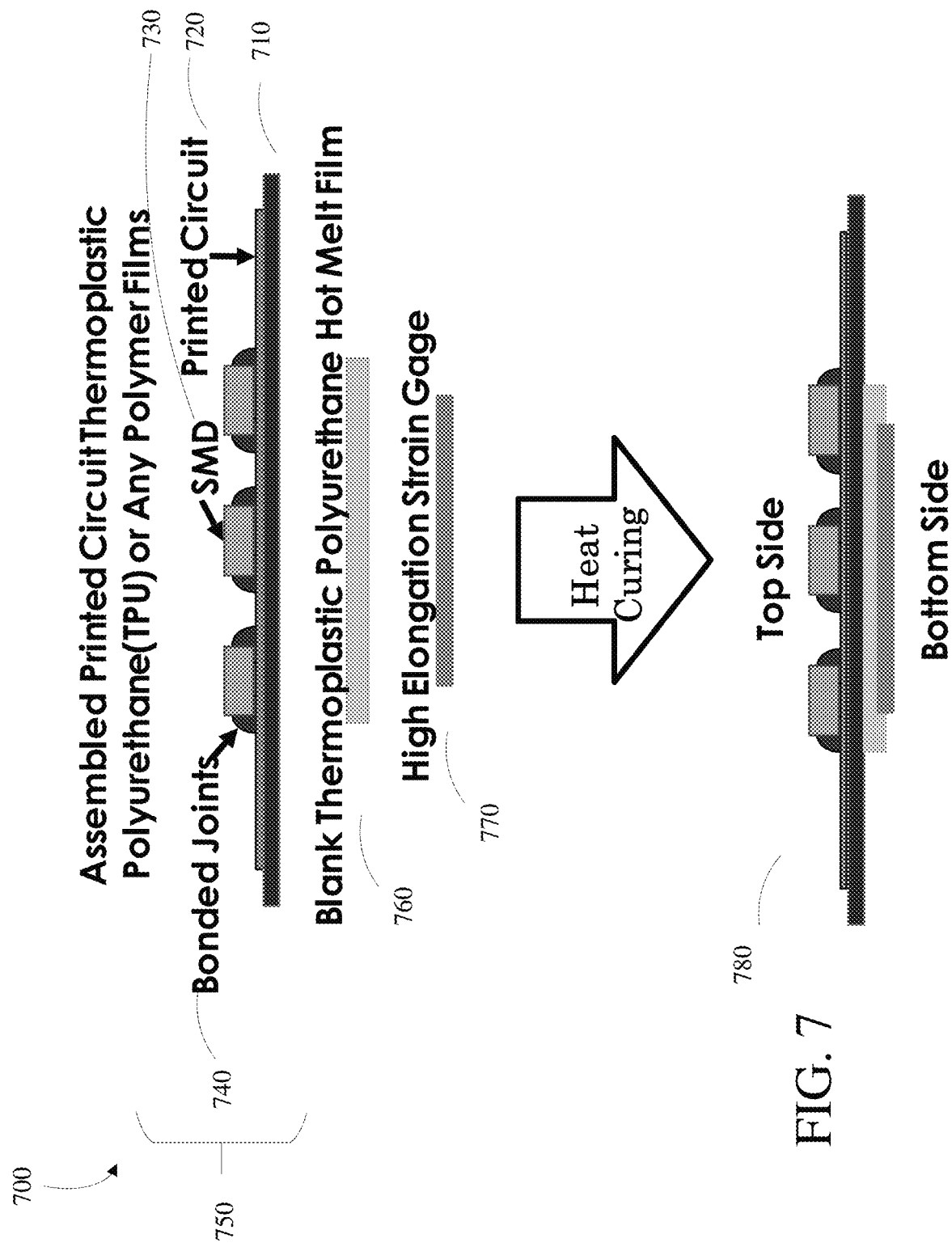
FIG. 7 is a flow diagram of a process for adhesive circuit patterning in accordance with certain implementations.

FIG. 7 is a flow diagram of a process 700 for using adhesive circuit patterning with strain gauges in accordance with certain implementations. The process 700 may include preparation of a blank thermoplastic polyurethane hot melt film 760. Although thermoplastic polyurethane hot melt film is described herein, implementations may use thermal adhesive films and the like. In the example implementation, the blank thermoplastic polyurethane hot melt film 760 may undergo drying to prevent shrinkage and drive out moisture. For example, the blank thermoplastic polyurethane hot melt film 760 may be dried for 2-4 hours at a temperature of 70°-80° C. In an implementation, the softening point of the thermoplastic polyurethane hot melt film 760 is around 80°–120° C. and the melting point is around 150° C. (being heated for 45 minutes). The temperatures and times are illustrative and may vary depending on the type of thermal adhesive film being used.

After drying, a circuit trace or circuit pattern (collectively circuit pattern) may be printed on a blank TPU, polymer film or thermal film 710. This is shown as printed circuit 720. In an implementation, the blank TPU, polymer film or thermal film 710 may, prior to being printed on, undergo drying to prevent shrinkage and drive out moisture. Although printing is described herein, other techniques may be used to deploy the printed circuit 720 on the blank TPU, polymer film or thermal film 710 without departing from the scope of the description and the claims herein. The printed circuit 720 on the TPU, polymer film or thermal film 710 are collectively heat cured.

After curing, surface mounted devices 730 may be bonded or otherwise attached to the printed circuit 720, shown as bonded joints 740, to form an assembled printed circuit TPU, polymer film or thermal film 750. The blank thermoplastic polyurethane hot melt film 760 may then be placed on a bottom (unpopulated side) of the assembled printed TPU, polymer film or thermal film 750. A strain gauge 770 may then be placed on the other side of the blank thermoplastic polyurethane hot melt film 760. A bonding process may be activated at a temperature above the melting point, and by adding a defined amount of pressure, the strain gauge 770 may be bonded to the unpopulated side of the assembled printed TPU, polymer film or thermal film 750 to form adhesive circuit patterned device 780.

Figures 8A, 8B:
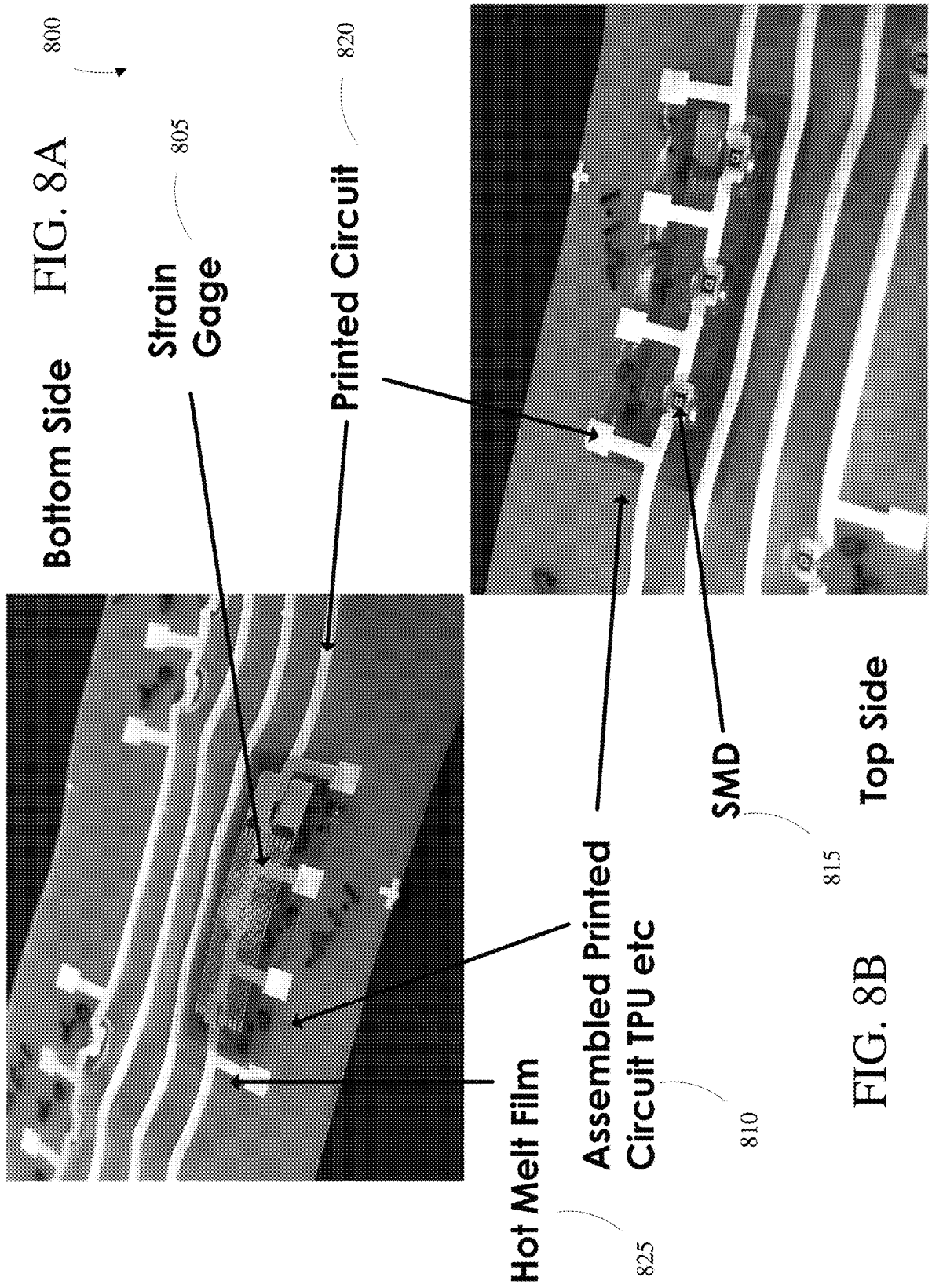
FIG. 8A-B are example photographs of flexible electronics after application of the process for adhesive circuit patterning in accordance with certain implementations.

FIG. 8A-B are example photographs of adhesive circuit patterned device 800 with strain gauge 805 in accordance with certain implementations. The adhesive circuit patterned device 800 includes an assembled printed circuit TPU, polymer film or thermal film 810 (as described in FIG. 7) which includes surface mounted device(s) 815 bonded to a printed circuit 820 and which has the strain gauge 805 bonded to an unpopulated side using thermoplastic polyurethane hot melt film 825, for example.

Figure 9:
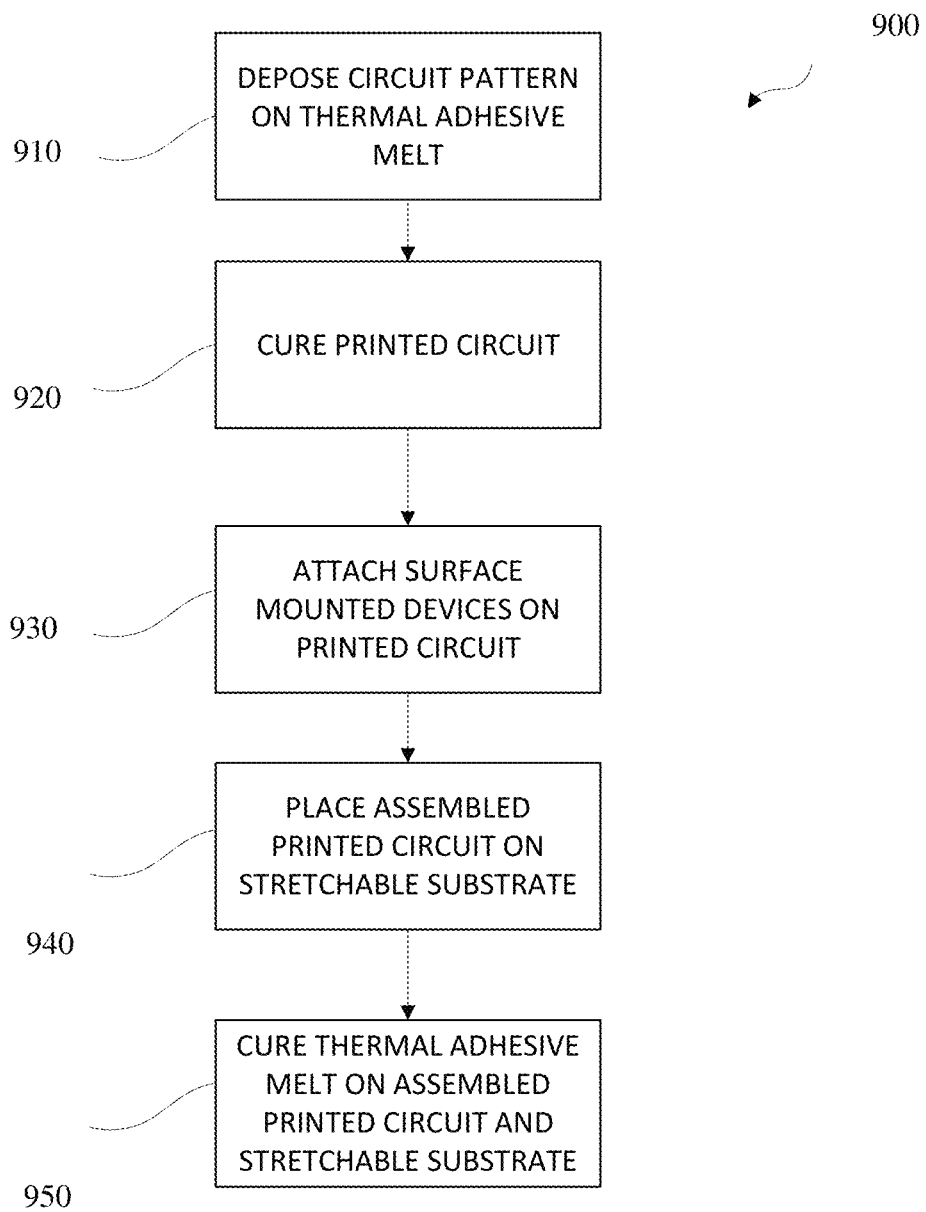
FIG. 9 is a flowchart of a process for adhesive circuit patterning in accordance with certain implementations.

FIG. 9 is a flowchart of a method 900 for adhesive circuit patterning process in accordance with certain implementations. The method 900 includes: deposing 910 a circuit pattern on a thermal adhesive film; curing 920 a printed circuit pattern; attaching 930 surface mounted device(s) to a cured printed circuit; placing 940 an assembled printed circuit on a stretchable or flexible substrate; and melting 950 another thermal adhesive film on the assembled printed circuit and the stretchable substrate.

The method 900 includes printing 910 a circuit pattern on a thermal adhesive film. In an implementation, the thermal adhesive film is a thermoplastic polyurethane hot melt film. In an implementation, the thermoplastic polyurethane hot melt film is dried to prevent shrinkage and to drive out moisture. In an implementation, deposing may include printing, screen printing or like techniques for applying materials to form the circuit pattern on the thermal adhesive film. In an implementation, the materials may be copper and other like materials.

The method 900 includes curing 920 a printed circuit. In an implementation, curing may be heat curing.

The method 900 includes attaching 930 surface mounted device(s) to a cured printed circuit. In an implementation, surface mounted device(s) are bonded to the cured printed circuit. In an implementation, curing is performed after placement of the surface mounted device(s) to the cured printed circuit. In an implementation, the curing may be heat curing.

The method 900 includes placing 940 an assembled printed circuit on a stretchable substrate. In an implementation, the stretchable substrate is a fabric.

The method 900 includes melting 950 another thermal adhesive film on the assembled printed circuit and the stretchable substrate. The melting 950 may include or be curing. In an implementation, curing may be heat curing. The melting 950 results in reinforcing and protecting the attached or bonded joints of the surface mounted device(s) and protecting the circuit pattern or printed circuit, and attaching the assembled printed circuit to the stretchable substrate in one melting or curing step. In an implementation, the thermal adhesive film is a thermoplastic polyurethane hot melt film. In an implementation, the thermoplastic polyurethane hot melt film is dried to prevent shrinkage and to drive out moisture.

Figure 10:
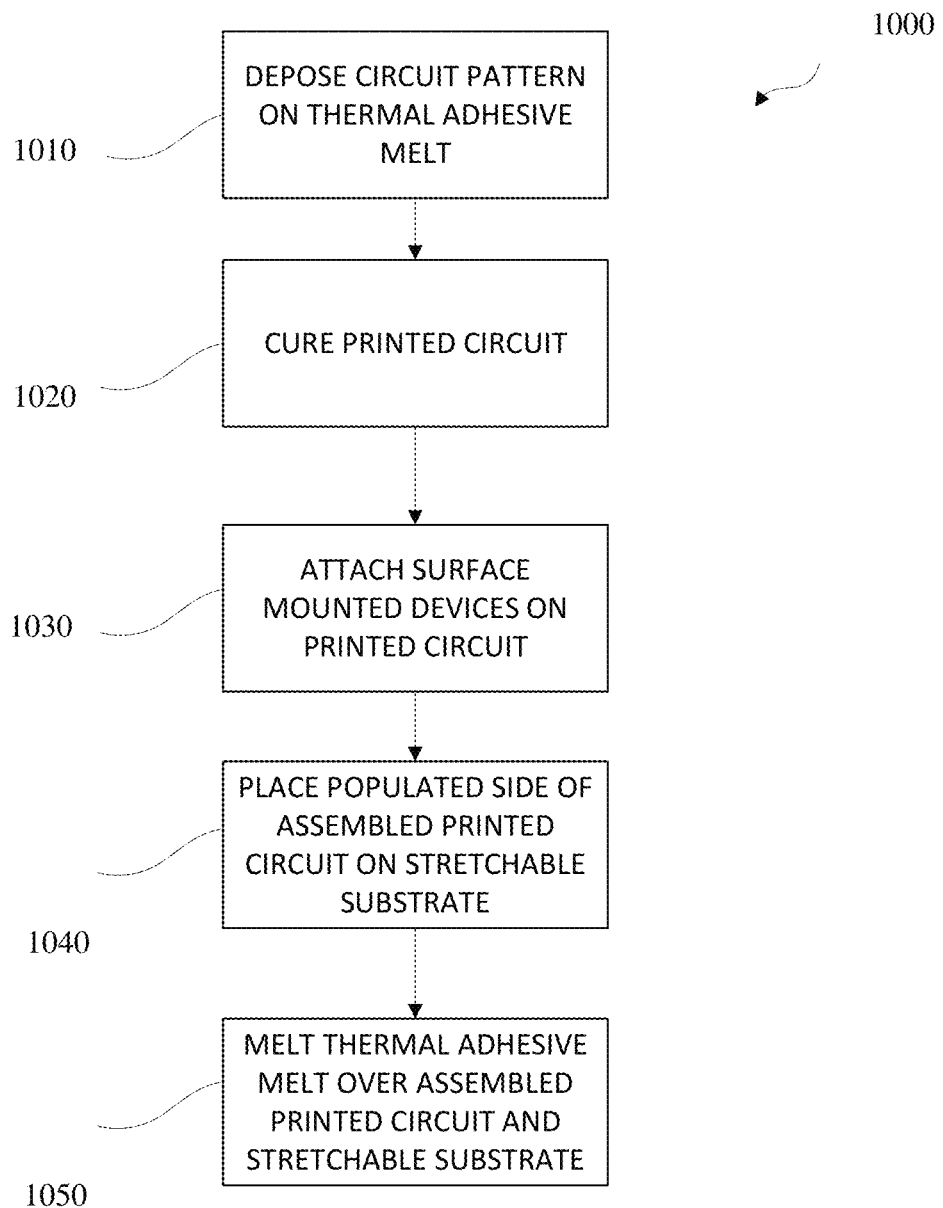
FIG. 10 is a flowchart of another process for adhesive circuit patterning in accordance with certain implementations.

FIG. 10 is a flowchart of a method 1000 for adhesive circuit patterning process in accordance with certain implementations. The method 1000 includes: deposing 1010 a circuit pattern on a thermal adhesive film; curing 1020 a printed circuit; attaching 1030 surface mounted device(s) to a cured printed circuit; placing 1040 a populated side of an assembled printed circuit on a stretchable substrate; and melting or curing 1050 the thermal adhesive film over the assembled printed circuit and the stretchable substrate.

The method 1000 includes printing 1010 a circuit pattern on a thermal adhesive film. In an implementation, the thermal adhesive film is a thermoplastic polyurethane hot melt film. In an implementation, the thermoplastic polyurethane hot melt film is dried to prevent shrinkage and to drive out moisture. In an implementation, deposing may include printing, screen printing or like techniques for applying materials to form the circuit pattern on the thermal adhesive film. In an implementation, the materials may be copper and other like materials.

The method 1000 includes curing 1020 a printed circuit. In an implementation, curing may be heat curing.

The method 1000 includes attaching 1030 surface mounted device(s) to a cured printed circuit. In an implementation, surface mounted device(s) are bonded to the cured printed circuit. In an implementation, curing is performed after placement of the surface mounted device(s) to the cured printed circuit. In an implementation, the curing may be heat curing.

The method 1000 includes placing 1040 a populated side of an assembled printed circuit on a stretchable substrate. In an implementation, the populated side includes the surface mounted device(s). In an implementation, the stretchable substrate is a fabric.

The method 1000 includes melting 1050 the thermal adhesive film on the assembled printed circuit and the stretchable substrate. The melting 1050 may include or be curing. In an implementation, curing may be heat curing. The melting 1050 results in reinforcing and protecting the attached or bonded joints of the surface mounted device(s) and protecting the circuit pattern or printed circuit, and attaching the assembled printed circuit to the stretchable substrate in one melting or curing step. In an implementation, the thermal adhesive film is a thermoplastic polyurethane hot melt film. In an implementation, the thermoplastic polyurethane hot melt film is dried to prevent shrinkage and to drive out moisture.

Figure 11:
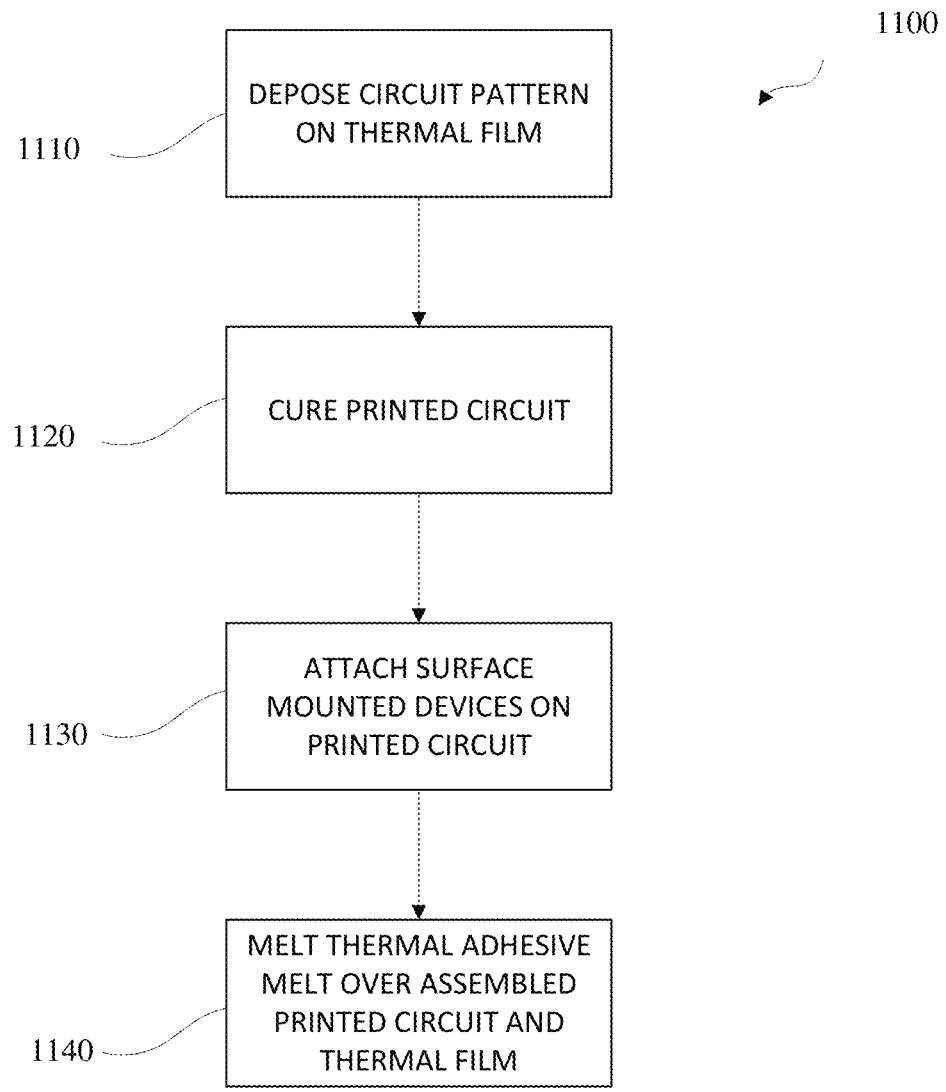
FIG. 11 is a flowchart of another process for adhesive circuit patterning in accordance with certain implementations.

FIG. 11 is a flowchart of a method 1100 for adhesive circuit patterning process in accordance with certain implementations. The method 1100 includes: depositing 1110 a circuit pattern on a thermal film; curing 1120 a printed circuit; attaching 1130 surface mounted device(s) to a cured printed circuit; and melting or curing 1140 a thermal adhesive film on an assembled printed circuit thermal film.

The method 1100 includes printing 1110 a circuit pattern on a thermal film. In an implementation, the thermal film is a thermoplastic polyurethane (TPU), polymer film, and/or thermal film. In an implementation, the thermoplastic polyurethane (TPU), any polymer film, and/or thermal film is dried to prevent shrinkage and to drive out moisture. In an implementation, depositing may include printing, screen printing or like techniques for applying materials to form the circuit pattern on the thermal film. In an implementation, the materials may be copper and other like materials.

The method 1100 includes curing 1120 a printed circuit. In an implementation, curing may be heat curing.

The method 1100 includes attaching 1130 surface mounted device(s) to a cured printed circuit. In an implementation, surface mounted device(s) are bonded to the cured printed circuit. In an implementation, curing is performed after placement of the surface mounted device(s) to the cured printed circuit. In an implementation, the curing may be heat curing.

The method 1100 includes melting 1140 a thermal adhesive film on an assembled printed circuit thermal film. The melting 1140 may include or be curing. In an implementation, curing may be heat curing. The melting 1140 results in reinforcing and protecting the attached or bonded joints of the surface mounted device(s) and protecting the circuit pattern or printed circuit. In an implementation, the thermal adhesive film is a thermoplastic polyurethane hot melt film. In an implementation, the thermoplastic polyurethane hot melt film is dried to prevent shrinkage and to drive out moisture.

Figure 12:
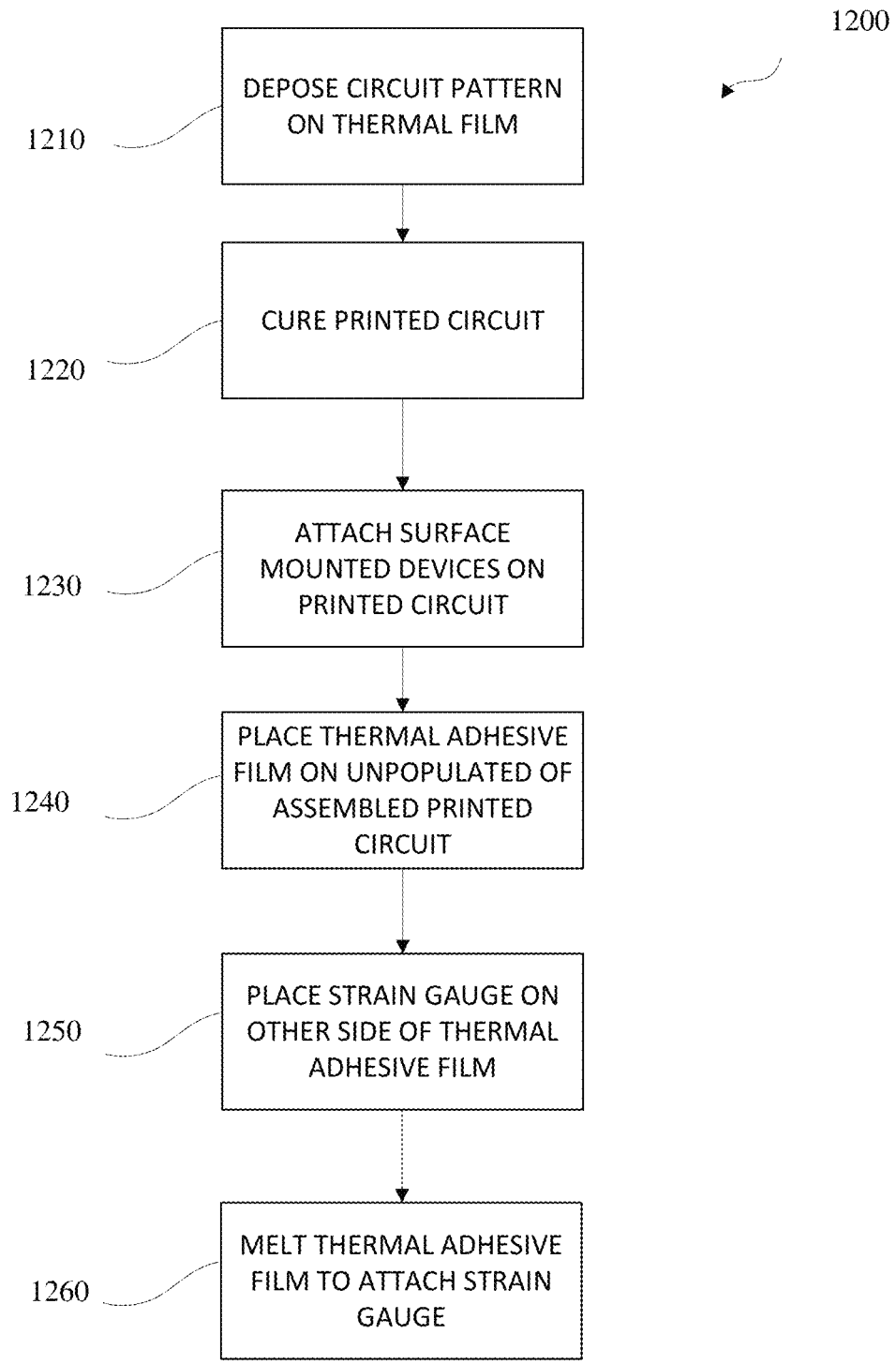
FIG. 12 is a flowchart of a process for adhesive circuit patterning with a strain gauge in accordance with certain implementations.

FIG. 12 is a flowchart of a method 1200 for adhesive circuit patterning process in accordance with certain implementations. The method 1200 includes: depositing 1210 a circuit pattern on a thermal film; curing 1220 a printed circuit; attaching 1230 surface mounted device(s) to a cured printed circuit; placing 1240 a thermal adhesive film on an unpopulated side of an assembled printed circuit thermal film; placing 1250 a strain gauge on another side of the thermal adhesive film; and melting or curing 1260 the thermal adhesive film to attach the unpopulated side of the assembled printed circuit thermal film to the strain gauge.

The method 1200 includes printing 1210 a circuit pattern on a thermal film. In an implementation, the thermal film is a thermoplastic polyurethane (TPU), polymer film, and/or thermal film. In an implementation, the thermoplastic polyurethane (TPU), any polymer film, and/or thermal film is dried to prevent shrinkage and to drive out moisture. In an implementation, depositing may include printing, screen printing or like techniques for applying materials to form the circuit pattern on the thermal film. In an implementation, the materials may be copper and other like materials.

The method 1200 includes curing 1220 a printed circuit. In an implementation, curing may be heat curing.

The method 1200 includes attaching 1230 surface mounted device(s) to a cured printed circuit. In an implementation, surface mounted device(s) are bonded to the cured printed circuit. In an implementation, curing is performed after placement of the surface mounted device(s) to the cured printed circuit. In an implementation, the curing may be heat curing.

The method 1200 includes placing 1240 a thermal adhesive film on an unpopulated side of an assembled printed circuit thermal film. In an implementation, the unpopulated side may not contain the surface mounted device(s).

The method 1200 includes placing 1250 a strain gauge on another side of the thermal adhesive film. In an implementation, the strain gauge is a high elongation strain gauge.

The method 1200 includes melting 1260 the thermal adhesive film to attach an unpopulated side of the assembled printed circuit thermal film to the strain gauge. The melting 1260 may include or be curing. In an implementation, the curing may be heat curing. The melting 1260 results in attaching the strain gauge to the unpopulated side of the assembled printed circuit thermal film, where the unpopulated side includes a non-reactive surface. In an implementation, the thermal adhesive film is a thermoplastic polyurethane hot melt film. In an implementation, the thermoplastic polyurethane hot melt film is dried to prevent shrinkage and to drive out moisture. In an implementation, another thermal adhesive film may be melted on a populated side of the assembled printed circuit thermal film to reinforce and protect the attached or bonded joints of the surface mounted device(s) and protect the circuit pattern or printed circuit.

In general, a method for adhesive circuit pattering includes depositing a circuit pattern on a thermal adhesive film. One or more surface mounted device are attached to a cured printed circuit to form an assembled printed circuit. The assembled printed circuit is placed on a stretchable substrate. The thermal adhesive film is melted on the assembled printed circuit and the stretchable substrate to protect and reinforce joint bonds and the circuit pattern of the assembled circuit pattern and attach the assembled printed circuit to the stretchable substrate. In an implementation, another thermal adhesive film is placed on the assembled printed circuit, and where the melting includes melting the thermal adhesive film and the another thermal adhesive film to envelope the joint bonds and the circuit patterns of the assembled printed circuit. In an implementation, the thermal adhesive film and the another thermal adhesive film are thermoplastic polyurethane hot melt film. In an implementation, the thermal adhesive film and the another thermal adhesive film are dried prior to depositing to prevent shrinkage and drive out moisture. In an implementation, the placing includes placing a populated side of the assembled printed circuit on the stretchable substrate. In an implementation, the attaching includes bonding the one or more surface mounted device to the cured printed circuit. In an implementation, the method includes curing a printed circuit pattern.

In general, a method for adhesive circuit pattering includes depositing a circuit pattern on a thermal film. One or more surface mounted device(s) are attached to a cured printed circuit to form an assembled printed circuit. A thermal adhesive film is melted on the assembled printed circuit and the thermal film to protect and reinforce joint bonds and the circuit pattern of the assembled circuit pattern. In an implementation, the thermal film is one of a thermoplastic polyurethane (TPU) or polymer film. In an implementation, the thermal adhesive film is thermoplastic polyurethane hot melt film. In an implementation, the thermal film and the thermal adhesive film are dried prior to depositing to prevent shrinkage and drive out moisture. In an implementation, the attaching includes bonding the one or more surface mounted device to the cured printed circuit. In an implementation, the method includes curing a printed circuit pattern.

In general, a method for adhesive circuit pattering includes deposing a circuit pattern on a thermal film. One or more surface mounted device are attached to a cured printed circuit to form an assembled printed circuit. A thermal adhesive film is placed on an unpopulated side of the assembled printed circuit and a strain gauge is placed on another side of the thermal adhesive film. The thermal adhesive film is melted to attach the unpopulated side of the thermal film to the strain gauge. In an implementation, the thermal adhesive film is thermoplastic polyurethane hot melt film. In an implementation, the thermal film is one of a thermoplastic polyurethane (TPU) or polymer film. In an implementation, the thermal adhesive film and the thermal film is dried prior to deposing to prevent shrinkage and drive out moisture. In an implementation, the attaching includes bonding the one or more surface mounted device to the cured printed circuit. In an implementation, the method includes curing a printed circuit pattern. In an implementation, the method includes placing another thermal adhesive film on the assembled printed circuit, and wherein the melting at least the thermal adhesive film includes melting the another thermal adhesive film to envelope the joint bonds and the circuit patterns of the assembled printed circuit.

The construction and arrangement of the methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials and components, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps, and decision steps.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for adhesive circuit patterning consisting of:
   printing a circuit pattern directly on a single thermal adhesive film;
   placing one or more surface mounted devices on a cured printed circuit of the printed circuit pattern;
   after the placing of the one or more surface mounted devices on the cured printed circuit, curing the one or more surface mounted devices and the cured printed circuit together to form an assembled printed circuit;
   after the curing, placing the assembled printed circuit on a stretchable substrate; and
   after the placing of the assembled printed circuit on the stretchable substrate, melting the single thermal adhesive film directly onto the assembled printed circuit and the stretchable substrate to reinforce joint bonds of the assembled printed circuit and to attach the assembled printed circuit to the stretchable substrate.

2. The method of claim 1, wherein the curing of the one or more surface mounted devices and the cured printed circuit together is heat curing.

3. The method of claim 1, wherein the printing comprises screen printing the circuit pattern directly on the single thermal adhesive film.

4. A method for adhesive circuit patterning consisting of:
   printing a circuit pattern directly on a single thermal adhesive film to form a printed circuit on the single thermal adhesive film;
   curing the printed circuit to form a cured printed circuit on the single thermal adhesive film;
   attaching one or more surface mounted devices to the cured printed circuit to form an assembled printed circuit on the single thermal adhesive film;
   placing the assembled printed circuit on a stretchable substrate; and
   after the attaching and the placing, melting the single thermal adhesive film directly onto the stretchable substrate to reinforce joint bonds between the one or more surface mounted devices and the cured printed circuit and to connect the assembled printed circuit to the stretchable substrate by heating the single thermal adhesive film to a melting temperature.

5. The method of claim 4, wherein the curing is heat curing.

6. The method of claim 4, wherein the attaching comprises placing the one or more surface mounted devices on the cured printed circuit and curing the one or more surface mounted devices and the cured printed circuit together to form the assembled printed circuit on the single thermal adhesive film.

7. A method for adhesive circuit patterning consisting of:
   drying a single thermal adhesive film to prevent shrinkage and drive out moisture,
   printing a circuit pattern directly on the single thermal adhesive film,
   placing one or more surface mounted devices on a cured printed circuit of the printed circuit pattern;
   after the placing of the one or more surface mounted devices on the cured printed circuit, curing the one or more surface mounted devices and the cured printed circuit together to form an assembled printed circuit;
   after the curing, placing the assembled printed circuit on a stretchable substrate; and
   after the placing of the assembled printed circuit on the stretchable substrate, melting the single thermal adhesive film directly onto the assembled printed circuit and the stretchable substrate to reinforce joint bonds of the assembled printed circuit and to attach the assembled printed circuit to the stretchable substrate.

\* \* \* \* \*